United States Patent [19]

McElroy

[11] 4,333,167

[45] Jun. 1, 1982

[54] DYNAMIC MEMORY WITH ON-CHIP REFRESH INVISIBLE TO CPU

[75] Inventor: David J. McElroy, Houston, Tex.

[73] Assignee: Texas Instruments Incorporated, Dallas, Tex.

[21] Appl. No.: 82,371

[22] Filed: Oct. 5, 1979

[51] Int. Cl.³ .................. G11C 7/00; G11C 11/40
[52] U.S. Cl. .................................................. 365/222
[58] Field of Search ......................................... 365/222

[56] References Cited

U.S. PATENT DOCUMENTS

| 4,040,122 | 8/1977 | Bodin | 365/222 |
| 4,112,514 | 9/1978 | Spoelder | 365/222 |
| 4,290,120 | 9/1981 | Stein | 365/222 |

FOREIGN PATENT DOCUMENTS

| 2024474 | 1/1980 | United Kingdom | 365/222 |

Primary Examiner—Stuart N. Hecker
Attorney, Agent, or Firm—John G. Graham

[57] ABSTRACT

A semiconductor device comprises an array of rows and columns of dynamic-type memory cells with on-chip refresh circuitry which automatically produces a refresh operation invisible to the CPU. The refresh circuitry includes an address counter and a multiplexer to insert the refresh address when an internal clock indicates a refresh cycle. The refresh address counter is incremented after each refresh cycle. If a refresh command is being executed when an address presented, the refresh operation is completed then the device is accessed in the usual manner. By specifying the access time of the device as the sum of the usual access type plus the time needed for refresh, the internal refresh is invisible to the CPU.

14 Claims, 23 Drawing Figures

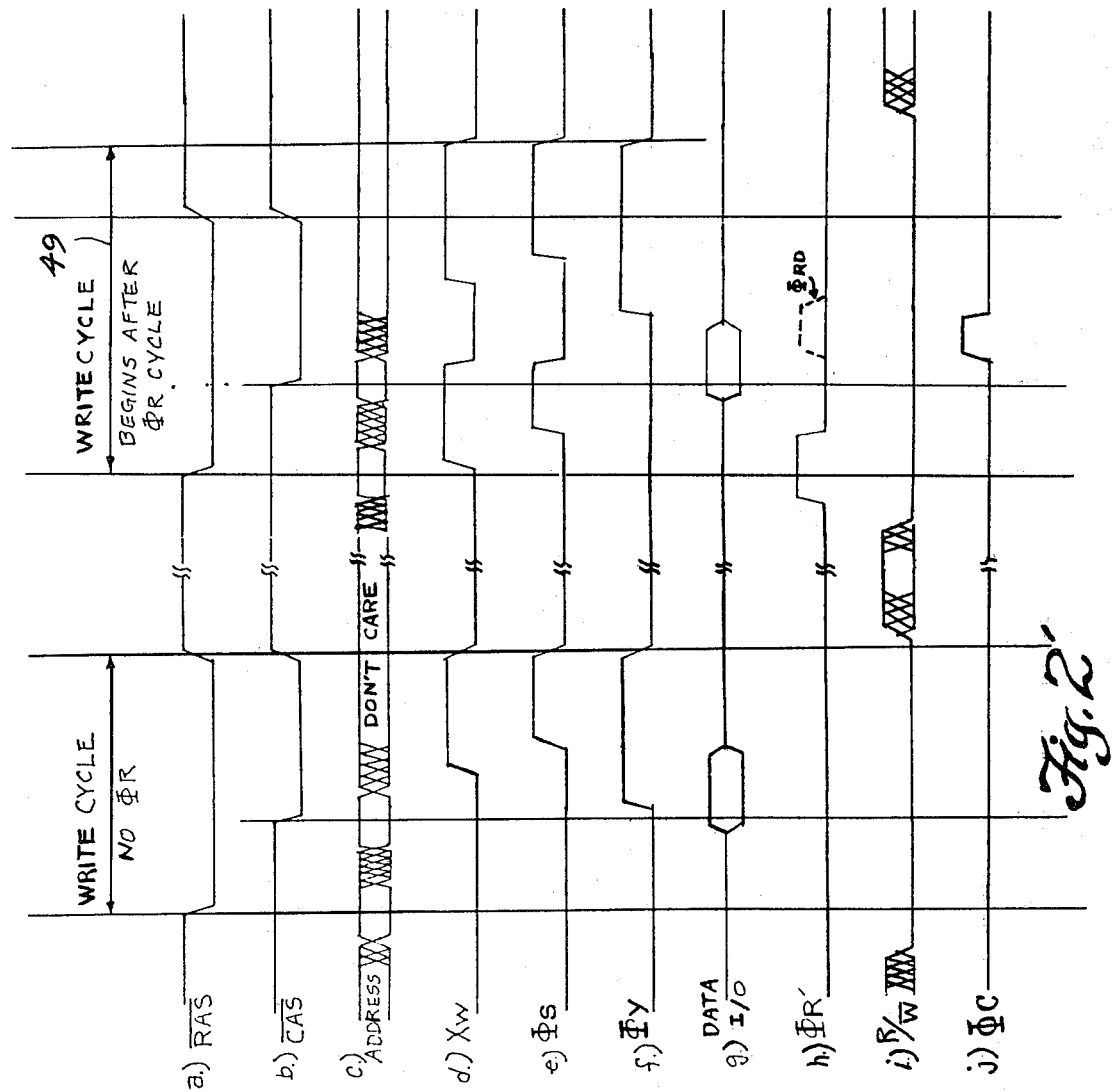

DYNAMIC MEMORY WITH ON-CHIP REFRESH INVISIBLE TO CPU

BACKGROUND OF THE INVENTION

This invention relates to semiconductor memory devices and more particularly to a dynamic memory device which functions as a static memory device.

The most widely used semiconductor memory devices at present are one-transistor dynamic memory cells as described in U.S. Pat. No. 3,940,747, issued Feb. 24, 1976, to Kuo and Kitagawa, assigned to Texas Instruments. Higher density versions of these dynamic memory systems are shown in Electronics magazine, Sept. 13, 1973, pp. 116–121, Feb. 19, 1976, at pp. 116–121, May 13, 1976, pp. 81–86, and Sept. 28, 1978, pp. 109–116. These high density devices use one-transistor dynamic memory cells which have the advantage of very small size, and thus low cost, but have the disadvantage of requiring external refresh systems. Each row of an array of cells must be addressed above every two milliseconds to restore the data because the stored voltages will leak off the capacitors in the memory cells. Refresh imposes both programming and hardware burdens on the system.

Usually refresh is accomplished by sequentially accessing a bit in a row of a dynamic RAM in either a burst refresh mode where consecutive access cycles are used to refresh all rows, or in a distributed refresh mode where the refresh cycles are distributed over the entire refresh period. In either case, the memory system requires a counter (eight bits long for 256 rows, for example) for the refresh address, plus a system interrupt mechanism to allow the refresh to occur, and a timer to indicate when refresh should occur, whether burst or distributed mode is used. In a large memory system the overhead circuitry to provide the refresh control is a small part of the system cost, so dynamic RAMs are widely used in medium to large memory systems. However, in small memory systems of the type usually associated with small minicomputers and microprocessors the refresh control circuitry is a significant portion of the system cost, so static RAMs are often substituted for dynamic RAMs in spite of the higher cost of static RAMs. A single-board microcomputer, for example, may need to use one-third of the board space for refresh control if dynamic RAMs are used.

The typical static RAM cell requires six transistors, or four transistors and two polysilicon resistors, so the cell size is much greater than the one transistor and one capacitor used in dynamic RAMs. Static cells which provide reduced area are shown in U.S. Pat. No. 4,110,776 issued to Rao, Stanczak, Lien and Bhatia, assigned to Texas Instruments. Various types of "self-refreshing" cells have been demonstrated, such as in U.S. Pat. Nos. 3,955,181 issued to Joseph H. Raymond, Jr., 4,092,735, 4,139,785 or 4,142,111 issued to David J. McElroy, and 4,070,653 issued to Rao, Rogers and McElroy, all assigned to Texas Instruments; these self-refresh cells provide apparently static operation in that refresh is accomplished without addressing the cells. Still, the cell size and cost per bit for static RAMs or pseudo static RAMs have not reached that of dynamic RAMs.

In copending application Ser. No. 918,891, now U.S. Pat. No. 4,207,618, filed June 26, 1978, by White and Rao and assigned To Texas Instruments, a pseudo static memory is disclosed which is a standard dynamic RAM having an on-chip row address counter to produce refresh addresses. The counter is incremented by refresh commands from external to the chip. A similar system is shown at pp. 94–97 of Electronics Design, Sept. 1, 1979.

It is a principal object of this invention to provide improved memory systems and devices made in semiconductor integrated circuits. Another object is to provide an improved "pseudo static" type MOS memory device, particularly a memory device of small size (using one transistor dynamic cells, for example) and not requiring refresh address or command inputs. An additional object is to provide small area pseudo static memory elements in semiconductor integrated circuits, particularly memory devices employing dynamic cell arrays with all of the refresh overhead incorporated on the same chip. A further object is to provide a pseudo static RAM wherein refresh is invisible to the CPU.

BRIEF DESCRIPTION OF THE DRAWINGS

The novel features believed characteristic of the invention are set forth in the appended claims; the invention itself, however, as well as other features and advantages thereof, will best be understood by reference to the following detailed description of a particular embodiment, read in conjunction with the accompanying drawings, wherein:

FIGS. 2a–2j and 2'a–2'j are graphic representations of voltage vs time for electrical waveforms or signals appearing in the systems of FIGS. 1 and 1a.

DETAILED DESCRIPTION OF SPECIFIC EMBODIMENT

Figure 1:
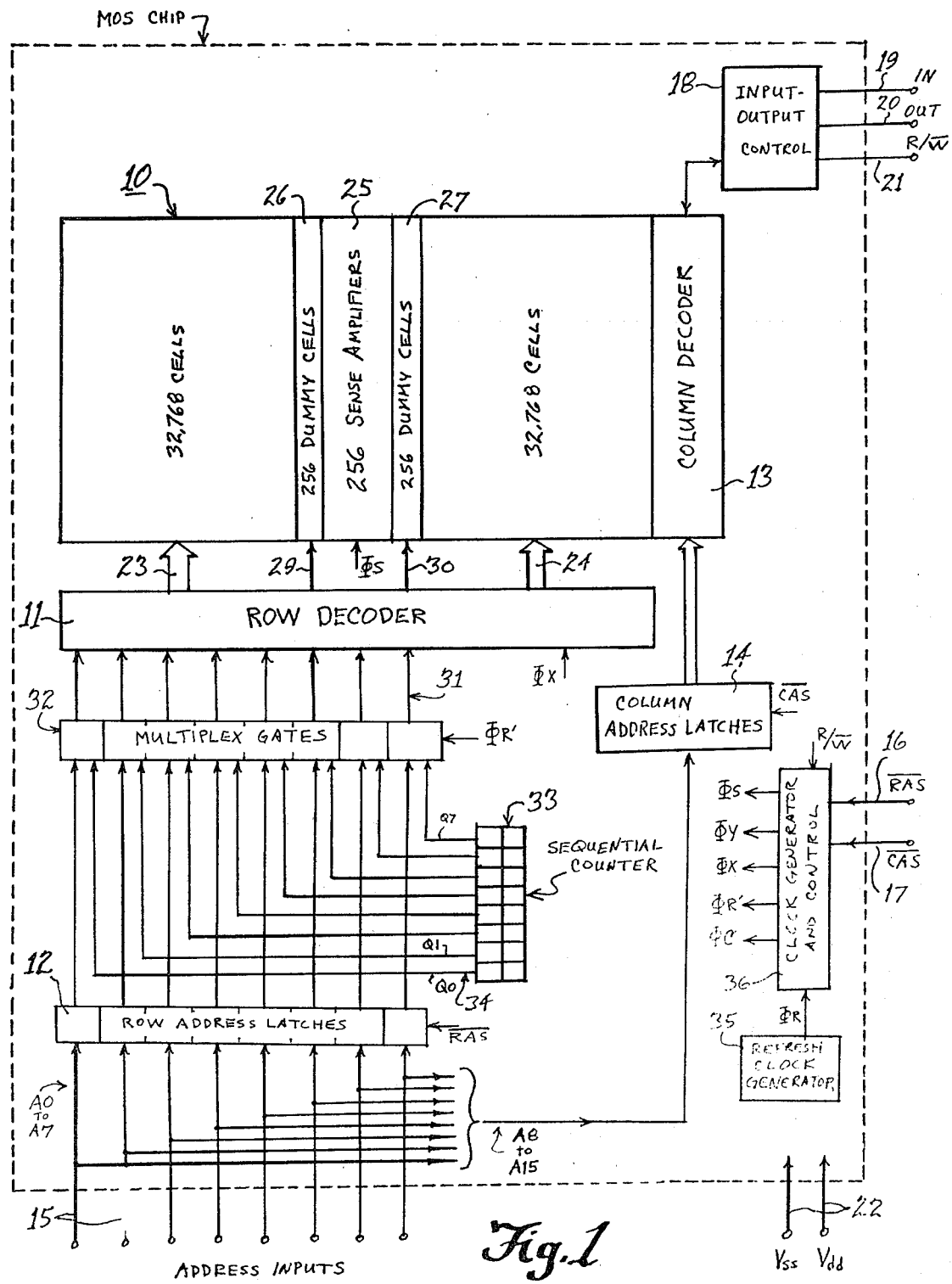
FIGS. 1 and 1a are electrical diagrams in a block form of a memory device including the on-chip refresh of the invention.

A memory device which may use the invention is shown in FIG. 1. The concept of the invention is particularly useful in very high density memory devices containing, for example, 65,536 or 261,824 cells on one silicon chip of about one-twentieth square inch. This type of device may be made by an N-channel silicon-gate self-aligned MOS process which is described in U.S. patent application Ser. No. 648,594, filed Jan. 12, 1976, or 722,841, now U.S. Pat. No. 4,240,092, filed Sept. 13, 1976, by C-K Kuo, both assigned to Texas Instruments. In this embodiment the device consists of an array 10 of 65,536 memory cells generally divided into 256 rows and 256 columns; each cell is a so-called one transistor cell of the type shown in said Electronics articles or said applications Ser. No. 648,594, or Ser. No. 722,841. For normal access a row decoder 11 selects one of the 256 row lines as determined by a row or X address contained in an eight-bit row address latch 12, and a column decoder 13 selects one of the 256 column lines as determined by a column or Y address contained in an eight-bit column address latch 14. For normal operation these addresses are applied to the chip by eight address lines 15 on a time-share basis, while for refresh the row address is internally generated. When an $\overline{RAS}$ or row address strobe input 16 (seen in FIG. 2a) goes to logic "0" or zero volts, the row address buffers 12 are enabled for normal read or write operation to accept row address bits A0 to A7 (seen in FIG. 2c) from the lines 15. During a refresh operation, no row address input is present as will be explained. When $\overline{CAS}$ or column address strobe input 17 (see in FIG. 2b) goes to logic "0" or zero volts the column address buffer 14 is enabled to accept a column address (bits A8 to A15) from the lines 15. The row and column addresses must be valid on the pins 15 during the time periods shown in FIG. 2c. Sixteen address bits are needed to uniquely define one bit of 65,536 cells ($2^{16}$=65,536). Input/output control circuitry 18 is connected to the array 10 via column decoder 13, and functions to apply data to the column lines from a data input pin 19, or to detect data on the column lines and apply it to a data output pin 20 (see FIG. 2g), under control of a read/write R/W input 21 (see FIG. 2i) as well as under control of various internally generated clock and logic voltages. The device receives supply voltages on pins 22; these typically include a Vdd supply voltage of +5 V as well as ground or Vss. The decoder 11 is of conventional design and functions to select one of 128 row lines 23 on the left or one of 128 row lines 24 on the right of a set of 256 sense amplifiers 25 and apply a row voltage Xw to the selected row line which goes high after $\overline{RAS}$ goes low (FIG. 2d); the remaining 255 row lines remain low. A7, the MSB of the row address, selected right or left side and also determines activation of a row of dummy cells 26 or 27 on the opposite side of the sense amplifiers from the selected memory cell via lines 29 or 30. The sense amplifiers 25 located in the center of each column line are usually bistable circuits as described in detail in the above-mentioned U.S. Pat. Nos. 3,940,747, 4,050,061, or 4,081,701. The sense amplifiers are activated by a sense clock $\Phi$S seen in FIG. 2e.

According to the invention, the row decoder 11 receives at inputs 31 either a normal address from the input terminals 15 via the latches 12 or a refresh address, this selection being made by eight multiplex gates 32. These gates 32 are responsive to a refresh clock $\Phi$R' which causes the gates to apply the refresh address bits Q0-Q7 to the decoder 11. When the clock $\Phi$R' is not present, the normal address from the latches 12 passes through the eight multiplex gates 32 to the decoder 11. The refresh address is generated in a sequential counter 33 which produces an eight bit address Q0-Q7 on lines 34 that sequences through the 256 possible row addresses, one at a time. The address in the sequential counter changes each time a refresh clock $\Phi$R' appears as derived from $\Phi$R, an output of an on-chip refresh clock generator 35. A control circuit 36 receives the refresh clock $\Phi$R and other signals R/$\overline{W}$, $\overline{RAS}$, $\overline{CAS}$, and produces the $\Phi$R' clock as well as other controls.

Figure 3:
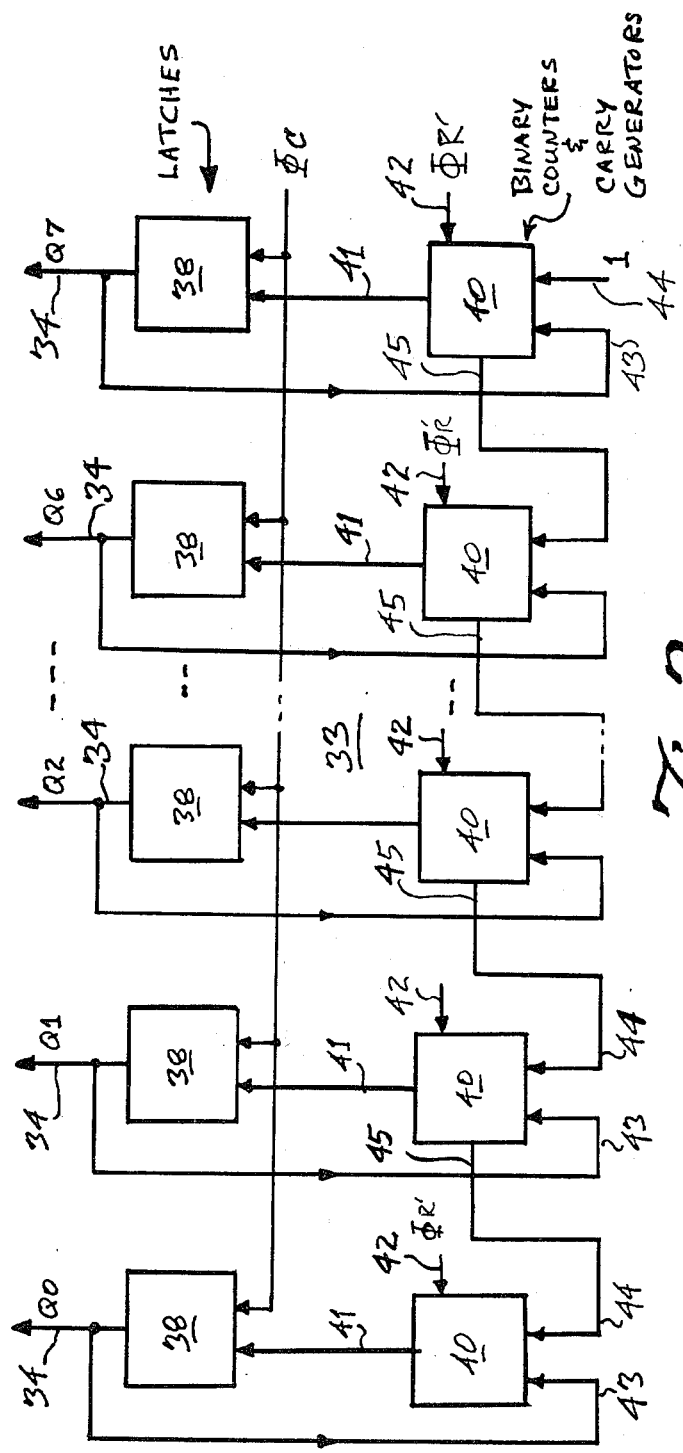
FIG. 3 is an electrical diagram in clock form of details of a refresh address counter of the system of FIG. 1.

The rows must be addressed in some sequence, one at a time, so that each of the rows is addressed within the maximum refresh time of the memory device, which is usually two or four milliseconds in present dynamic RAMs. The column address is not needed; if present it is superfluous. Various types of counters which advance one count for each input clock may be used for the refresh counter 33. The address sequence need not advance in order, so long as no address is repeated; thus a pseudo-random shift counter as seen in U.S. Pat. No. 4,074,355 might be used. An example of a counter which advances in regular numerical sequence is seen in FIG. 3. The counter includes eight latches 38 (clocked D type flip flops) which latch the internally-generated refresh address received from a series of eight binary adder or counter stages 40. Each adder stage is a standard logic circuit which produces a one or zero on an output 41 when a clock $\Phi$R' is present at a clock input 42, in response to binary inputs 43 and 44. Each input 44 is connected to receive a carry output 45 from the preceding stage 40; the input 43 is connected to the output 34 of the latch stage. The input 44 of the first stage 40 is connected to logic "1" so it always has a carry input. The latches 38 can change only if a clock $\Phi$C is present; this clock is generated in the control circuit 36 and occurs at the end of a cycle when the refresh signal $\Phi$R has occurred and $\Phi$s has returned to "0". The latches 38 will then receive the address on the lines 41 and will remain in this state until after another refresh signal. When $\Phi$R' goes high the counter stages 40 ripple through to the next count before $\Phi$C occurs. When a refresh signal occurs, the address applied to the decoder 11 via lines 34 and multiplexers 32 is that which was generated in the counter stages 40 at the previous refresh signal, then stored in the latches 38 after $\Phi$S went high.

Figure 2:
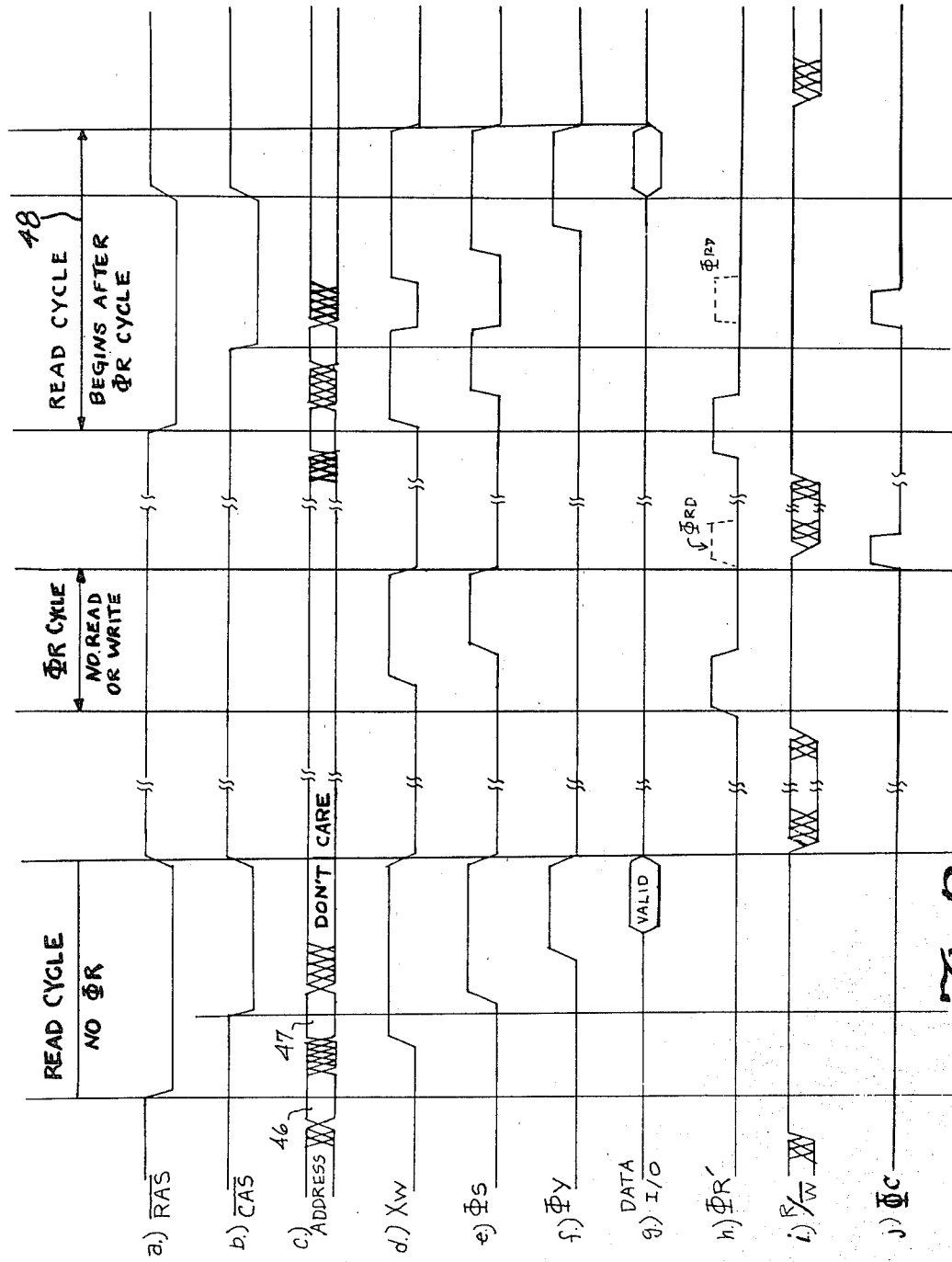

Timing of a normal read cycle with no $\Phi$R occurring is seen at the left of FIG. 2. The R/W input 21 is high; the row addresses must be valid on lines 15 during the interval 46 of FIG. 2c. An Xw output, FIG. 2d, from the row decoder 11 occurs next, activating one of the row lines. Meanwhile, the column addresses must be valid at interval 47 of FIG. 2c and are latched in by $\overline{CAS}$. The sense amplifiers are operated by the occurrence of $\Phi$S, FIG. 2e, which drives te column lines to a full logic level. Then the column decoders are activated when $\Phi$Y goes high, FIG. 2f, so the bit on the selected column or Y line is coupled to the I/O circuit 18 and causes the output bit on pin 20 to be valid during the time indicated in FIG. 2g.

A refresh cycle with no read or write is seen next in FIG. 2. Here no $\overline{RAS}$ or $\overline{CAS}$ occurs, so no addresses are latched in, and no $\Phi$Y occurs so no data bit is coupled in or out. R/$\overline{W}$ must be high. $\Phi$R' at the input of the multiplexer 32 applies the address from the counter 33 to the row decoder 11, producing an Xw voltage on the selected row line as seen in FIG. 2d, followed by $\Phi$S of FIG. 2e to activate the sense amplifiers and refresh all 256 bits in the selected row.

If a read cycle is initiated after a refresh cycle begins as seen next in FIG. 2, the refresh cycle is completed then the read cycle implemented. The row and column addresses are latched in at $\overline{RAS}$ and $\overline{CAS}$ in the usual timing, then held in the latches 12 and 14 while the row addressing using the refresh counter output is completed (FIG. 2d) and an $\Phi$S operation completed. Then another row address is decoded from the latches 12, another Xw occurs (different row selected), followed by another $\Phi$S, FIG. 2e. Therefore, $\Phi$Y and Data Out occur as seen in FIG. 2f and 2g just as in a normal read cycle. The time period 48 for this operation is then the specified "access time" of the device. Data may be available at the output earlier, but if the memory is accessed when refresh is occurring then there is a wait period while the refresh is completed.

A normal write cycle is seen next in FIG. 2'. The R/W signal is low, FIG. 2i, which inhibits generation of $\Phi$R'. The address latching is the same as for a read cycle. As seen in FIG. 2g a bit is coupled through the I/O control 18 and into a selected column when $\Phi$Y goes high, FIG. 2f. Then Xw and $\Phi$S occur, FIGS. 2d and 2e, driving the selected column line to full logic level, and causing the bit to be stored in the selected cell, while the other cells in the row are refreshed.

When a write cycle begins after a ΦR' cycle has been started as seen next in FIG. 2', the addresses and data-input must be latched in and held while the refresh operation is completed. Thus, $\overline{RAS}$, $\overline{CAS}$, and row and column addresses (FIGS. 2c,b,c), occur just as in the normal write operation. ΦY must be delayed so that the data bit won't be written into the row defined by the counter 33 instead of the X address input. So after Xw and ΦS have cycled high/low (refresh) as in FIGS. 2d and 2e, ΦY will go high then Xw will reoccur with the new address from the latches 12 and ΦS will reoccur to store the bit in the selected location. The time period 49 for this operation is therefore the specified time for a write cycle to account for the possibility of a write operation being initiated while an internal refresh is occurring.

If the refresh time is 4 ms., the time between ΦR pulses will be about 15 microsec. If the access time or refresh cycle is about 300 nsec or 0.3 microsec, then the probability of overlap is only about 2%. In addition, a memory device is being accessed only a very small percentage of the total time That a computer is powered up, so statistically the overlapped refresh/read or refresh/write operations 48 or 49 of FIG. 2 occur only once in perhaps 5,000 refresh cycles.

Figure 1A:
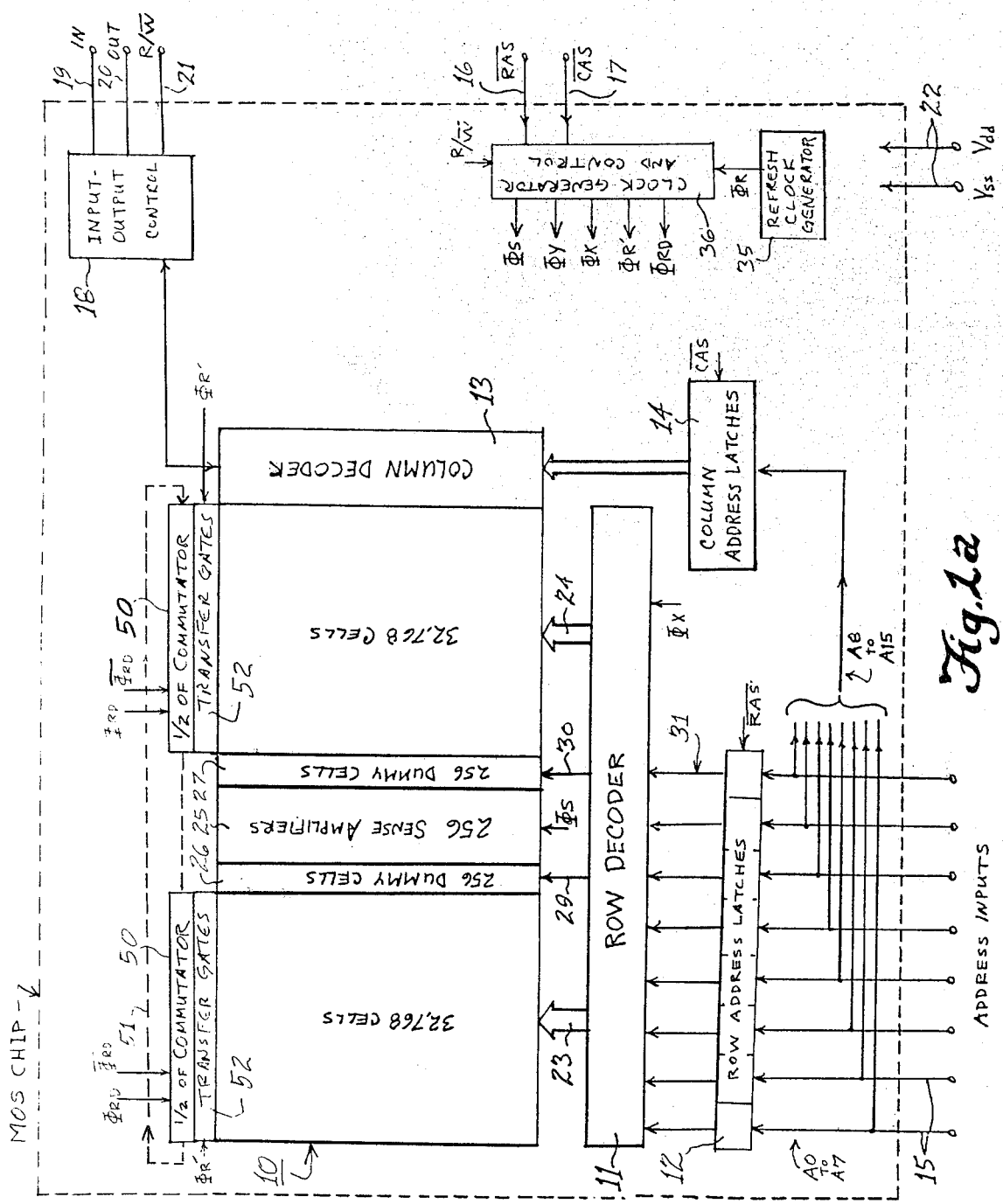

Another embodiment of the invention is shown in FIG. 1a, which is in all respects the same as FIG. 1 except that the multiplex gates 32 and the sequential counter 33 are not used. The inputs 31 to the row address decoder 11 are directly from the row address latches 12 as in standard dynamic RAMs for ordinary memory access (read or write) operations. Refresh addresses are generated in a commutator 50 which in this example is a 256 bit serial shift register adapted to continuously circulate a "1" bit, one step for each ΦR' pulse. A feedback loop 51 connects the output of the 256th stage to the input of the first stage. The commutator is constructed to come up with all stages zero except stage one upon power-up; this is usually done by transistor sizes or by implants. The output of each commutator stage is connected to one of the 256 row lines in the array 10 via 256 transfer gates 51. These gates remain non-conductive until ΦR' occurs which connects an Xw voltage from the stage containing a "1" to the selected row line, thus providing a refresh address. After a short delay, ΦS occurs as seen in FIG. 2 and refresh is implemented. The appropriate dummy cells 26 and 27 are addressed when ΦR' occurs, using standard circuitry (not shown). After ΦR', a delayed refresh pulse ΦRD is generated as seen in FIG. 2h or 2h'; this pulse (and its complement $\overline{\Phi RD}$) is used to advance the shift register commutator 50 after a refresh operation is complete so the next refresh cycle will use the next row. As before, the output repetition rate of the refresh clock generator 35 is selected to cycle the 256 rows within the specified refresh time, taking into account interleaved read or write cycles where refresh is done on an externally addressed row.

Although the invention has been described with reference to a specified embodiment, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed:

1. A semiconductor memory device comprising an array of memory cells in a single integrated circuit formed in a semiconductor body, the memory device having a refresh address counter included within said body along with means controlled within the body for incrementing the counter, addressing means included within the body for alternatively receiving an address from inputs to the device or from the counter and for accessing the array using said address and means included within the body for activating the means for incrementing the counter in a regular internally-defined timing sequence.

2. A device according to claim 1 wherein the memory cells are of the dynamic type and refresh of said cells is provided according to said regular timing sequence.

3. A device according to claim 2 wherein the cells are in an array of rows and columns, and only the rows are addressed from said address counter.

4. A device according to claim 3 wherein the counter has a number of bits determined by the number of rows in the array and each bit includes a bistable circuit.

5. A device according to claim 3 wherein the memory array has a sense amplifier for each column and timing signals are applied to the sense amplifiers to control sensing operations during access cycles, and wherein means are provided for producing a delayed timing signal when addresses are received from the counter and from said inputs.

6. A device according to claim 5 wherein the delayed signal is responsible to an enable signal received from a generator internal to the semiconductor body.

7. A device according to claim 1 along with a processing system including means for generating addresses for accessing the device and coupling the addresses to the semiconductor body, and means for receiving data output from said device at a delayed time position when said addresses occur when the means for incrementing is activated.

8. An internally-refreshed semiconductor memory device comprising an array of dynamic memory cells in a single integrated circuit formed in a semiconductor body, the memory cells being in an array of rows and columns with a sense and refresh amplifier for each column, the memory device having a refresh row address counter included within said body along with incrementing means for the counter, addressing means within said body for alternatively receiving a row address from inputs to the device or from the counter and for accessing the rows of the array using said address, and refresh signal generator means within the body for producing refresh signals at regular internally-defined intervals, the generator means coupling said refresh signals to the incrementing means and to the addressing means.

9. A device according to claim 8 wherein means are provided within said body for activating said sense and refresh amplifiers in response to the refresh signal.

10. A semiconductor memory device comprising an array of memory cells in a single integrated circuit formed in a semiconductor body, the memory device having refresh address generator means included within said body along with means for changing the address produced by the generator means, addressing means included within the body for alternatively receiving an address from inputs to the device or from the generator means and for accessing the array using said address, and means included within the body for activating the means for changing the address in a regular timing sequence.

11. A device according to claim 11 wherein the memory cells are of the dynamic type and refresh of said cells is provided according to said regular timing sequence.

12. A device according to claim 11 wherein the cells are in an array of rows and columns, the rows being addressed from the generator means, said generator means including a commutator having a number of stages equal to the number of rows.

13. A device according to claim 12 wherein the commutator is coupled to the rows of the array by transfer gates which are controlled by said means for activating.

14. A device according to claim 13 wherein the commutator circulates a logic bit and is advanced one stage for each refresh cycle by the means for changing the address.

* * * * *

UNITED STATES PATENT AND TRADEMARK OFFICE
CERTIFICATE OF CORRECTION

PATENT NO. : 4,333,167
DATED : June 1, 1982
INVENTOR(S) : David J. McElroy

It is certified that error appears in the above-identified patent and that said Letters Patent are hereby corrected as shown below:

Column 1 line 21, change "above" to --about--.
Column 2 line 48, change "application" to --applications--.
Column 3 line 14, change "R/W" to --R/$\overline{W}$--.
Column 3 line 25, change "selected" to --selects--.
Column 4, line 21, change "R/W" to --R/$\overline{W}$--.

Signed and Sealed this

Twelfth Day of October 1982

[SEAL]

Attest:

GERALD J. MOSSINGHOFF

Attesting Officer   Commissioner of Patents and Trademarks